United States Patent [19]
Dew et al.

[11] Patent Number: 5,600,095
[45] Date of Patent: Feb. 4, 1997

[54] SPLICE FOR A SUPERCONDUCTING CABLE-IN-CONDUIT CONDUCTOR

[75] Inventors: Michael W. Dew, San Diego; Dennis W. Lieurance, San Marcos; Donald C. Rix, San Diego, all of Calif.

[73] Assignee: Lockhead Martin Corporation, Bethesda, Md.

[21] Appl. No.: 276,808

[22] Filed: Jul. 18, 1994

[51] Int. Cl.$^6$ .............................. H01R 4/00; H01R 43/00; H01F 41/04; H01L 39/24

[52] U.S. Cl. ................... 174/84 R; 174/88 R; 174/94 R; 174/15.5; 174/15.6; 29/599; 29/869; 29/873; 505/925; 505/926; 505/927; 174/125.1

[58] Field of Search ................................. 174/84 R, 94 R, 174/125.1, 88 R, 15.5, 15.6, 21 R; 505/925, 926, 927; 29/599, 863, 869, 872, 873

[56] References Cited

U.S. PATENT DOCUMENTS

| | | | |
|---|---|---|---|
| 3,317,658 | 5/1967 | Smith | 174/88 R X |
| 4,220,619 | 9/1980 | Kersten | 156/49 X |
| 5,004,865 | 4/1991 | Krupnicki | 174/15.6 X |

*Primary Examiner*—Laura Thomas
*Assistant Examiner*—Paramita Ghosh
*Attorney, Agent, or Firm*—John R. Duncan; Frank D. Gilliam

[57] ABSTRACT

A conductor splice and splice support structure and method of assembly for use with cable-in-conduit superconductor cable of the type having a plurality of spaced sub-cables each including stabilizer and superconductor strands in an annular tube. Two transition ramp members, each having a cross section varying from a first end conforming to the cable configuration to a second end having an enlarged, oval, configuration have a plurality of surface grooves each sized to hold one sub-cable. Between the two transition ramp members is provided a main support member having grooves aligned with the transition members grooves. The main support member grooves are sized to hold two overlapping sub-cables. Preferably, a braid of superconductor material is placed around the overlapping sub-cable ends. The space within the grooves surrounding the sub-cables is preferably filled with solder. A housing is preferably formed around the splice, with a connection through which a coolant, such as liquid helium, can be admitted to the splice and cables.

23 Claims, 5 Drawing Sheets

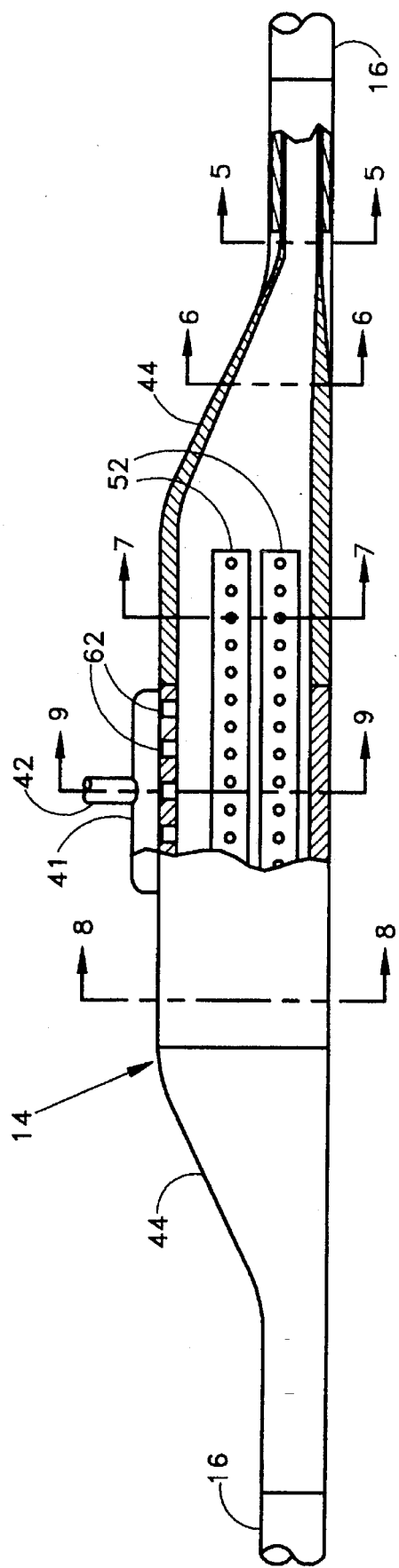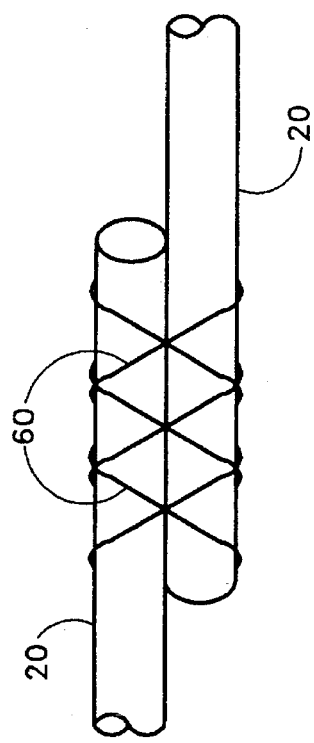

SPLICE FOR A SUPERCONDUCTING CABLE-IN-CONDUIT CONDUCTOR

BACKGROUND OF THE INVENTION

This invention relates in general to splices for electrical conductors and, more specifically, to a splice configuration particularly useful with superconducting cable-in-conduit conductors of the sort used in superconducting magnetic energy storage systems.

Superconducting magnetic energy storage (SMES) systems are capable of storing large amounts of electricity in a DC magnetic field for indefinite periods. Power from a utility grid or other power source such as a wind turbine or solar plant can be stored until needed, then returned to the utility grid or any specific application at any time. Utility applications include load leveling, spinning reserve, transmission system stability and reliability and voltage/power factor correction.

A SMES system often includes a cable-in-conduit conductor, which includes a superconducting alloy, wound into a large diameter coil or solenoid. The conductor is cooled to a temperature at which it becomes superconducting. With present commercial superconducting materials, the conductor is cooled with liquid helium to $-456°$ F. ($1.8°$ K.). In the cable-in-conduit configuration the conductor includes spaced superconducting cables in an annular ring around a metal tube containing the helium coolant. Typical SMES coils frequently are very large in diameter, often having diameters of over 100 feet.

Because of the length of the coils, it is necessary to splice lengths of cable to form the continuous coil. In large coils, one or more splices must be provided for every coil turn. These splices must have electrical and physical properties that do not degrade the performance of the coil.

With the usual materials, such as copper or aluminum, used at ambient temperatures, two cables are generally simply mechanically fastened together or soldered together. Typical of the prior art techniques for joining two conductors together are the crimp rings disclosed by Bennett in U.S. Pat. No. 3,231,964, and soldering as described by Mcintosh et al in U.S. Pat. No. 3,517,150.

Superconducting cables, however, have physical characteristics making such simple splicing techniques either unworkable or difficult. Superconductors are materials, often metals or ceramics, that lose all resistance when cooled below a critical temperature. Many materials have superconducting capabilities, although most only superconduct at temperatures approaching $0°$ K. The most practical for present use in superconducting magnets and the like are those that superconduct at or near the boiling temperature of liquid helium; typically, $V_3Ga$ and NbTi alloys and the compound $Nb_3Sn$. The most common method of splicing such superconductors has been the lap splice, where the cable ends are overlapped and soldered together. Such soldered lap splices exhibit relatively high resistance which can lead to excessive local heating, to the point where the spliced superconductors are raised above the critical superconducting temperature and cease to superconduct.

A number of different methods have been developed in order to connect ends of superconductor cables without interposing a high resistance material, such as solder, between them. Where the cable has multiple strands, simply overlapping the strands of each cable and crimping them together has been proposed by wada et al. in U.S. Pat. No. 4,794,688. However, this is not effective with many superconductor cables and provides only a mechanical joint which may have insufficient strength for some applications.

Multi-filament cable ends have been joined by intertwining the superconductor filaments, heating to a diffusion temperature then crimping a sleeve over the connection as described by Smathers in U.S. Pat. No. 5,111,574. This is a complex process which may degrade the superconducting properties and would be difficult to consistently accomplish outside of a laboratory environment.

Jones, in U.S. Pat. No. 4,631,808 places two cable ends in parallel, crimps a sleeve of superconducting material over the ends, then embeds the entire assembly in a conductor. This method, however, is not suitable for a continuous cable to be wound into a coil or the like.

Thus, there is a continuing need for a simple but effective method of splicing ends of superconducting cables together to form a longer cable suitable for winding into magnet coils, in particular SMES coils and the like, without degrading the electrical and physical properties of the coil and the coil structure.

SUMMARY OF THE INVENTION

The above noted problems, and others, are overcome by a splice and method of making a splice for connecting cable-in-conduit superconducting cables in which a plurality of sub-cables each comprising stabilizer and superconductor strands are supported in an annular tube. Two transition ramp members are provided, each varying in cross section from a circular first end conforming to the cable configuration to an enlarged, oval, second end. The sub-cables are separated from the tube and placed in grooves in the transition member. The very ends of the sub-cables extend beyond the transition members. The sub-cable ends are inserted in an overlapping relationship into a braided sleeve of superconducting material. The assembly of braid and sub-cable ends are placed in grooves in a main support member having grooves in alignment with the transition member grooves. All of the grooves are then filled with solder. Finally, a coolant retaining housing is emplaced over the splice region.

Since the splice has the same thickness as the superconductor cable, a uniform helical coil stack can be formed from the cable with plural splices.

BRIEF DESCRIPTION OF THE DRAWING

Details of the invention, and of preferred embodiments thereof, will be further understood upon reference to the drawing, wherein:

FIG. 4 is a plan view, partly cut away, of one splice;

FIG. 10 is a detail view of a tube of braided superconductor strands slipped over overlapping ends of subcables.

DETAILED DESCRIPTION OF PREFERRED EMBODIMENTS

Figure 1:
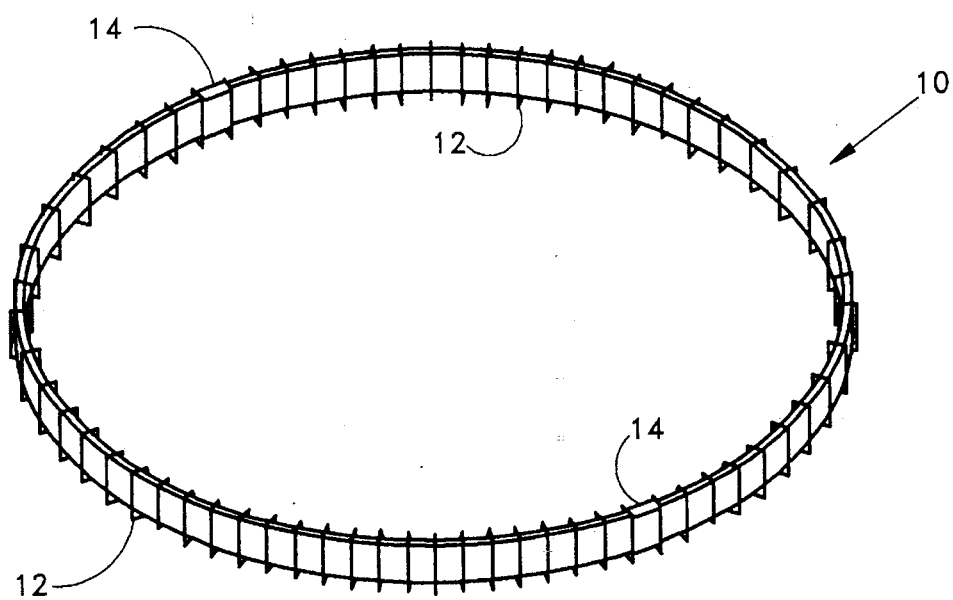
FIG. 1 is a schematic perspective view of a large magnet coil system using the splice of this invention.

As seen in FIG. 1, large superconducting magnet coils 10, such as those used in superconducting magnet energy storage systems include a number of helical coils stacked in a circular pattern. Typically, the diameter of the coil assembly may be hundreds of feet. Large support frames, schematically indicated at 12 are required to resist the large radial forces (Lorentz forces) produced by the intense magnetic field.

Because of limitations on the manufacture and transport of the superconductor cable, periodic splices are necessary. In the embodiment shown, two splices 14 are provided in each coil ring, on opposite sides of the coil. Because of the coil configuration, we have found that it is very advantageous to provide splices having the same thickness as the cable so that the adjacent coils can be stacked tightly together.

Figure 2:
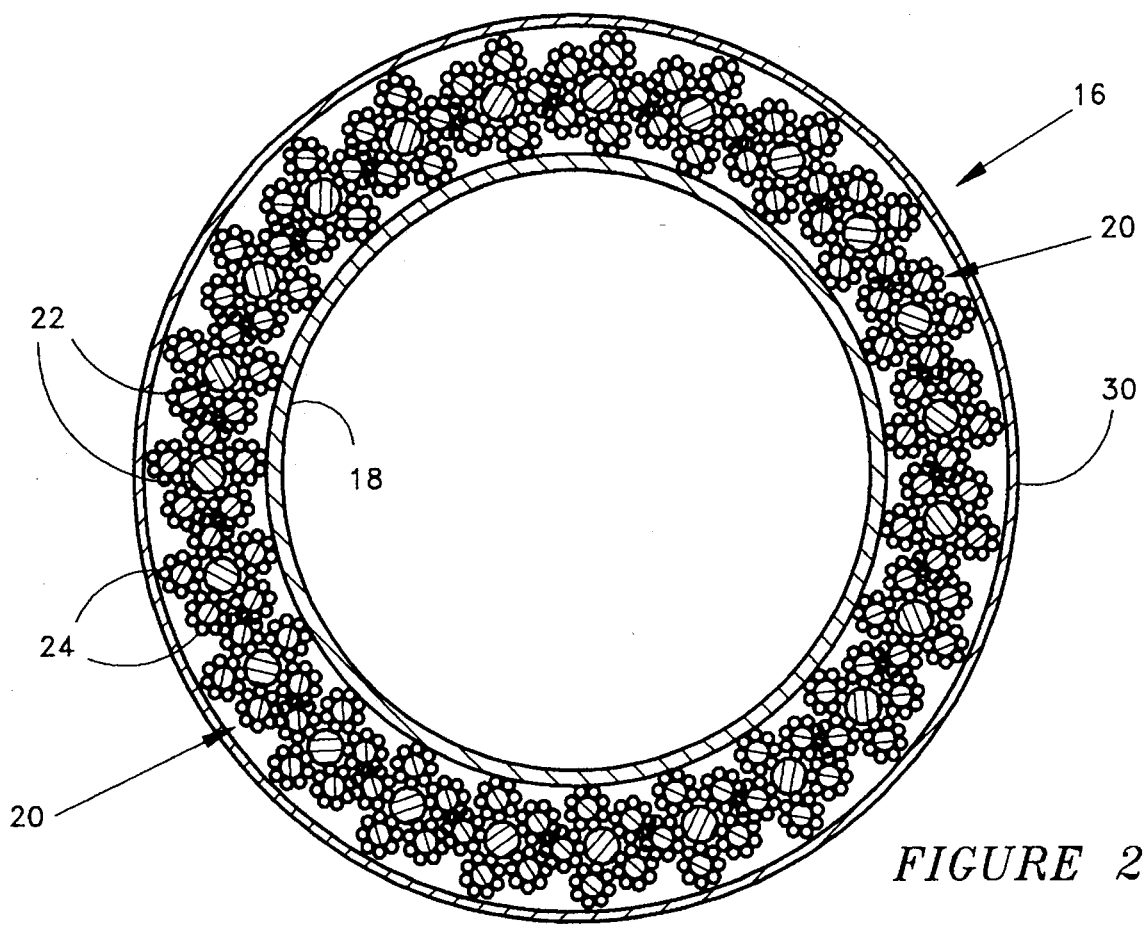
FIG. 2 is a transverse section through a prior art cable-in-conduit superconducting cable of the type particularly adapted to the splice of this invention.

A typical prior art cable-in-conduit superconductor cable 16 is shown in transverse section in FIG. 2. Basically, such a cable includes a central tube 18, which is solder tinned on the exterior. A plurality of sub-cables 20 are helically wound at a low pitch around tube 18. Each sub-cable 18 in the embodiment shown consists of a central copper filler wire 22 surrounded by five sub-sub-cables 24. Each sub-sub-cable 24 consists of a superconductor strand 26 (typically a Niobium-Titanium superconductor) surrounded by eight copper stabilizer strands 28 that are wrapped around and soldered to superconductor strand 26. A solder-tinned brass strip 30 is wrapped in a helix around the cable assembly to aid in resisting Lorentz forces. The assembly is encapsulated in a stainless steel conduit (not shown) which is compacted over the cable 16.

Sub-cables 20 may be coated with a solder paste prior to assembly, so that after assembly is completed the assembly can be heated to solder bond the sub-cables and other components together.

In operation, liquid helium or other suitable coolant, depending on the superconductor used, is circulated through tube 18 and through the annular conduit surrounding sub-cables 20 to maintain the superconductor below its critical temperature.

The superconducting cable shown in FIG. 2 must be spliced at appropriate points in a very large magnet coil. As can be appreciated from the showing in FIG. 2, splicing such a cable while maintaining the superconductor below the critical temperature and resisting the various forces encountered during coil operation is a complex undertaking.

Figure 3:
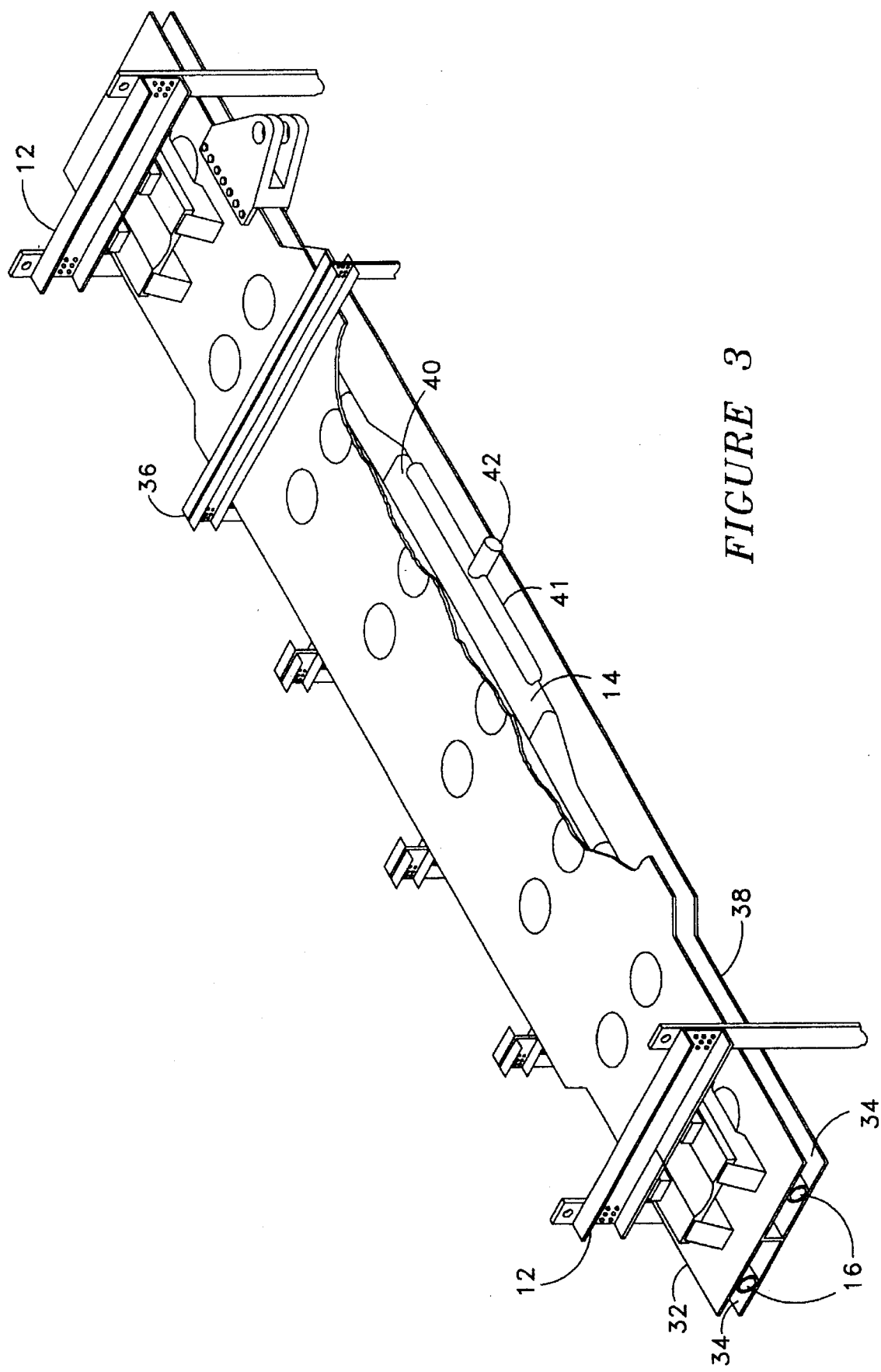
FIG. 3 is a perspective view of the splice and supporting structure.

A conductor splice according to this invention and the splice support structure installation are shown in FIG. 3. Two parallel cables 16 are supported in parallel in a flat pultrusion support 32 which is curved in the plane of the support to form the corresponding portion of the large coil ring. Support 32 includes two outwardly directed channels 34 which carry the cables 16. A conventional dump shunt 36 to carry off energy in the event of a quench is provided adjacent to each cable 16.

Spaced support frames 12 are provided to support the coil assembly. A plurality of compression clamps 36 are provided to maintain the stack of coil cables in supports 32 in compression.

Splices 14 have the same thickness as cables 16 and fit within channels 34, which are preferably slightly wider at 38 to better support the wider splice area. Splice 14 is housed in an enclosure 40. A manifold 41 communicates with the interior of enclosure 40. A helium port 42 allows helium to enter enclosure 40 and the cable during startup and to allow helium over pressure to be relieved in the event of a quench.

One of the two parallel splices 16 is shown in plan view, partly cut away, in FIG. 4. FIGS. 5–9 show section views taken on corresponding lines in FIG. 4. For clarity of illustration, the sub-cables 20 are shown as round, although they will generally have a configuration similar to that shown in FIG. 2.

Figure 5:
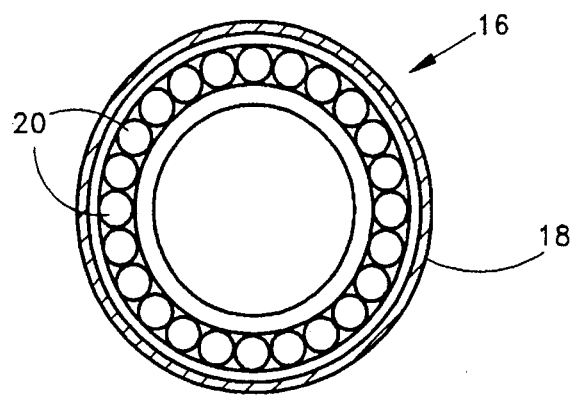
FIG. 5 is a section view taken on line 5—5 in FIG. 4.
Figure 6:
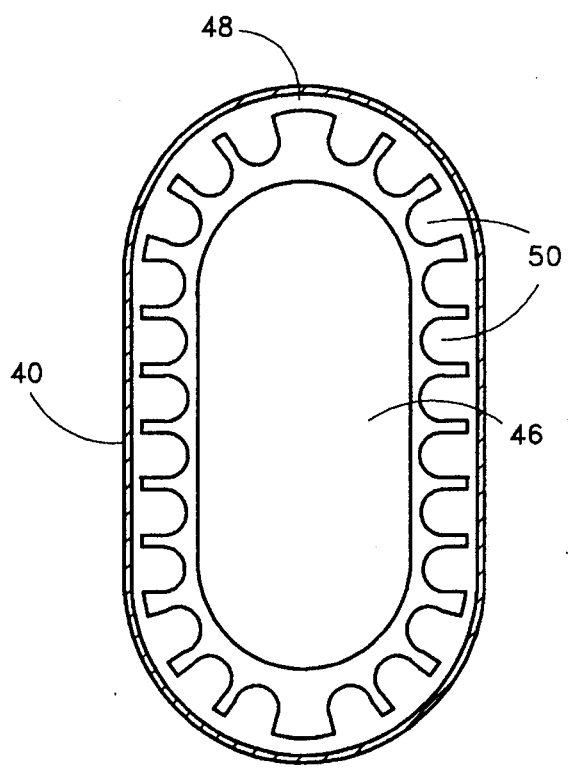
FIG. 6 is a section view taken on line 6—6 in FIG. 4.

Each transition ramp member 44 receives sub-cables from one end of a superconductor cable 16. AS seen in FIG. 5, sub-cables 20 in cable 16 are arranged in a circle around tube 18. Transition ramp member 44 has an open center 46 surrounded by an oval surface 48 of increasing width away from the cable. Grooves 50, one for each sub-cable 20, are formed in surface 48. Enclosure 40 surrounds the assembly.

Figure 7:
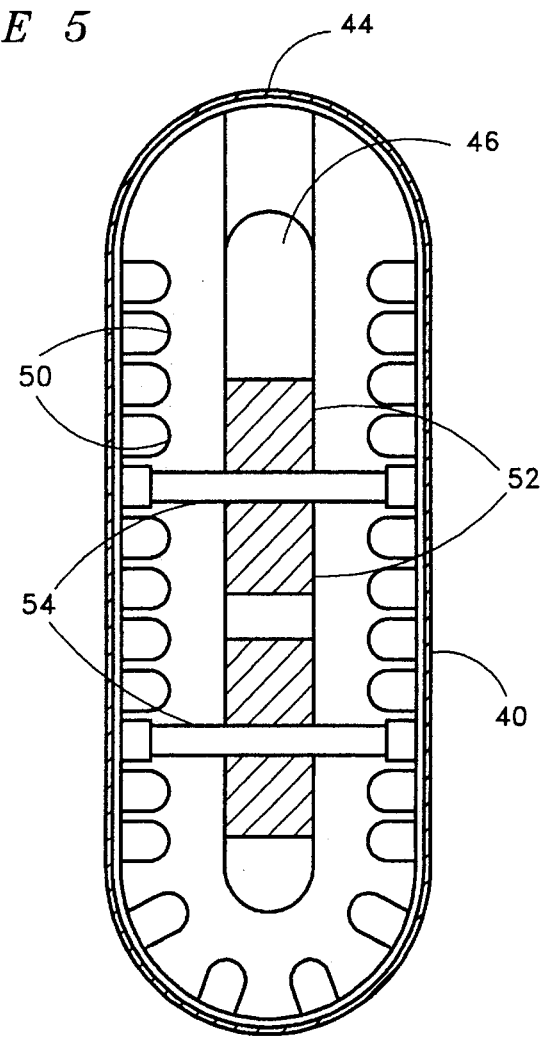
FIG. 7 is a section view taken on line 7—7 in FIG. 4.

Once the full splice width has been reached, as seen in FIG. 7, the grooves 50 lie entirely along the sides of transition member 44. In this region, support bars 52 are inserted within opening 46 and are held in place by a plurality of bolts 54. Generally, the lower support bar 52 is secured to one transition member 44 and the upper bar is secured to the opposite transition member, to allow each bar to be fastened to the other when the coil is assembled.

The transition members 44 can be assembled to this point at the cable fabrication location and all testing can be accomplished there. The cable lengths, with a transition member 44 at each end, is then transported to the coil assembly location.

A main support member 56 is then positioned between the two opposite transition members 44. The two support bars 52, are connected to each transition member 44, are slid into main support member 56 and on to the opposite transition member. All of the bolts 54 are then inserted and tightened.

Figures 8, 9:
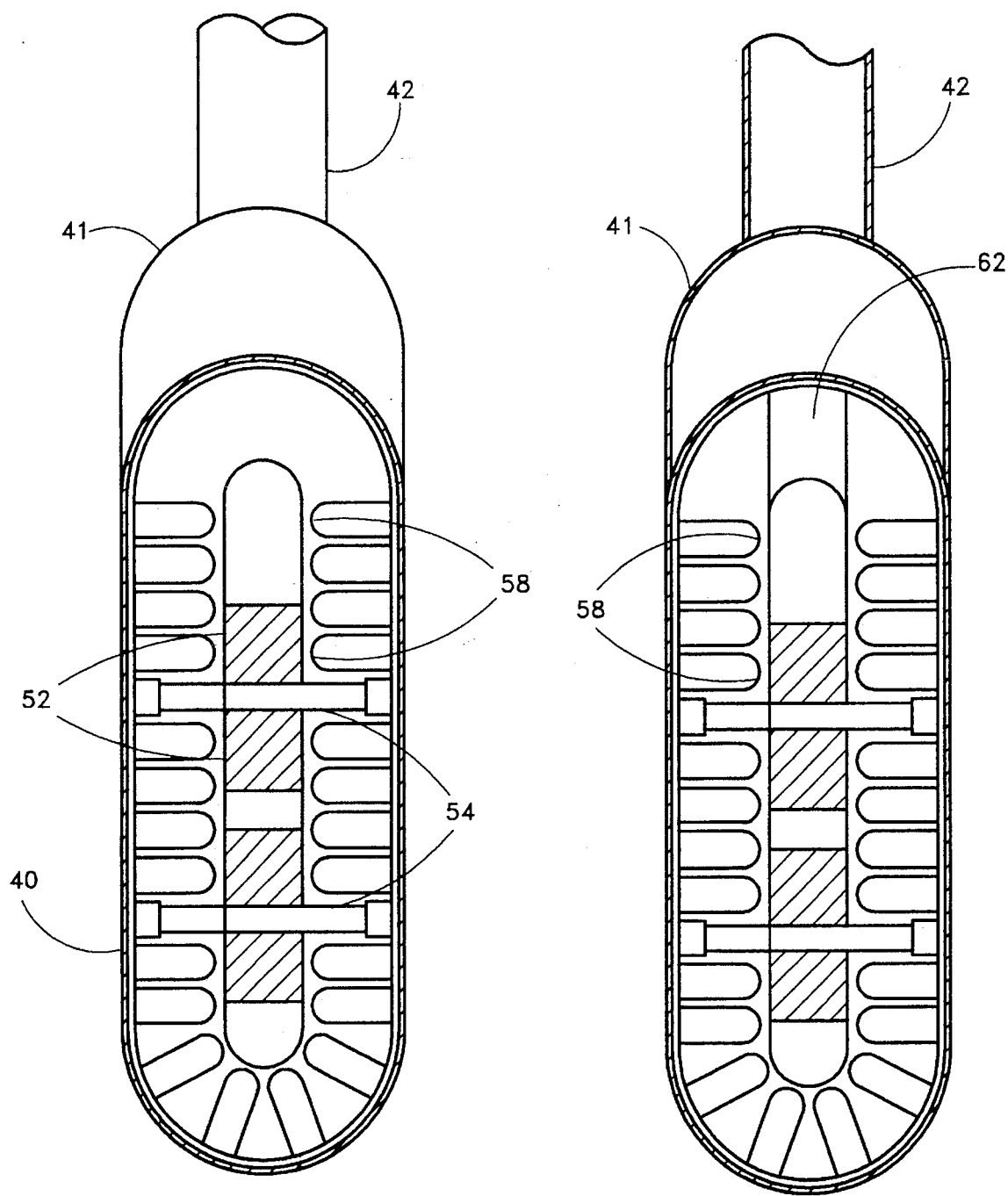
FIG. 8 is a section view taken on line 8—8 in FIG. 4.
FIG. 9 is a section view taken on line 9—9 in FIG. 4.

Grooves 58 in main support member 56 have depths twice the diameter of sub-cables 20, to permit overlapped ends to fit in the groove as seen in FIG. 9. Similarly, grooves 58 in one transition member 44 are deeper to transition to the double depth central grooves 58, as seen in FIG. 8.

One or more strands 60 of superconducting material, preferably the same material as in said cable, are brought into pressure contact with a cable end and can be wound in a helical manner along the two overlapping cables. For optimum performance, the strands 60 can be in the form of a hollow braid with the cable ends inserted into the braid and the braid pressed against the cable ends. In either case, after installation of the strands, sufficient molten solder is applied over the assembly to maintain the strands in place and add mechanical strength to the splice. Using the overwrapped superconducting strand effectively forms an equipotential surface around the cables to be spliced, thus increasing effective cable to cable contact area.

A tube of braided superconductor strands 60, as seen in the detail view of FIG. 10, is slipped over the ends of sub-cables 20 as they are brought into an overlapping relationship. The overlapped ends are then pressed into grooves 58.

Grooves 50 and 58 are then filled with solder to hold the sub-cables in place. Enclosure 44 is then placed around main support member 56 and sealed to the corresponding portions of the enclosure around transition members 44 such as by welding.

Perforations 62 are provided through support member 56 communicating with opening 46 and, ultimately, with the interior of tube 18 to allow ingress and egress of helium from tube 42 via manifold 41.

The resulting splice has a thickness equal to the diameter of cable 16, so that compression clamps 36 (as seen in FIG. 3) can keep the entire coil assembly in uniform compression, even in the splice regions. The splice has sufficient mechanical strength to fully accommodate all of the mechanical loads imposed during coil operation, start-up and quench.

While certain preferred materials, dimensions and arrangements have been detailed in conjunction with the above description of preferred embodiments, those can be varied, where suitable, with similar results. Other applications, variations and ramifications of this invention will occur to those skilled in the art upon reading this disclosure. Those are intended to be included within the scope of this invention as defined in the appended claims.

We claim:

1. A conductor splice and splice support structure for use with cable-in-conduit superconductor cable arranged in an annular tube having a plurality of spaced sub-cables each comprising stabilizer and superconductor strands, which comprises:

two transition ramp members, each varying in cross section from a circular first end conforming to the cable configuration to an enlarged, oval, second end;

each of said transition ramp members having a plurality of surface grooves, each of said grooves sized to hold one sub-cable;

a main support member having a plurality of grooves aligned with, and approximately twice as deep as, said transition ramp member grooves, each sized to hold two sub-cable ends in an overlapping arrangement;

strands formed from superconducting material for wrapping the overlapped sub-cable ends; and said transition ramp members and main support member having a thickness substantially equal to the thickness of said superconducting cable;

whereby said superconductor cable and said splice may be wound to form a coil having uniform thickness throughout each turn.

2. The conductor splice and splice support structure according to claim 1 wherein each of said transition ramp members and main support members have a communicating opening at the center thereof which communicates with the interior of said annular tube.

3. The conductor splice and splice support structure according to claim 2 further including at least one support bar within said opening extending through, and secured to, said main support member and said two transition ramp members when the splice structure is fully assembled.

4. The conductor splice and splice support structure according to claim 3 wherein two of said bars are provided and prior to assembly of said transition ramp members to said main support members one of said bars is secured to each of said transition ramp members.

5. The conductor splice and splice support structure according to claim 1 further including a housing around each of said transition ramp members and main support member to be sealed into a single housing when said splice is assembled.

6. The conductor splice and splice support structure according to claim 5 further including a plurality of holes through said main support member in fluid flow communication between an opening within said main support member and the interior of said housing.

7. The conductor splice and splice support structure according to claim 6 further including duct means on said housing for admitting liquid coolant into said housing and through said holes.

8. The conductor splice and splice support structure according to claim 1 wherein said superconducting material strands for wrapping are in the form of a braid tube into which sub-cable ends may be inserted.

9. The conductor splice and splice support structure according to claim 1 wherein said grooves in one of said transition ramp members have substantially uniform depths throughout their lengths approximately equal to the diameter of each of said sub-cables and said grooves in the opposite transition ramp member have depths approximately equal to the diameter of each of said sub-cables at the end conforming to the cable configuration and gradually increasing depths at the enlarged oval end to a depth approximately equal to twice the diameter of each of said sub-cables.

10. A conductor splice and splice support structure in a continuous cable-in-conduit superconductor cable which is contained in an annular tube, which comprises:

two adjacent ends of the superconductor cable having a plurality of spaced sub-cables each comprising stabilizer and superconductor strands;

two transition ramp members, each varying in cross section from a circular first end conforming to the cable configuration to an enlarged, oval, second end;

said transition ramp member having a plurality of surface grooves, each holding one of said sub-cables;

a main support member having a plurality of surface grooves aligned with, and approximately twice as deep as, said transition ramp member grooves, each holding two sub-cable ends in an overlapping arrangement;

means for securing said transition ramp member and said main support member together with said grooves in alignment;

strands formed from superconducting material around said overlapped sub-cable ends; and said transition ramp members and main support member having a thickness substantially equal to the thickness of said superconductor cable;

whereby said superconductor cable with said splice may be wound to form a coil having a uniform inner surface and a uniform turn thickness.

11. The conductor splice and splice support structure according to claim 10 wherein the space in each of said grooves around said sub-cable is filled with solder.

12. The conductor splice and splice support structure according to claim 10 wherein each of said sub-cables comprises a stabilizer strand surrounded by a plurality of sub-sub-cables each comprising a stabilizer strand surrounded by a plurality of superconductor strands.

13. The conductor splice and splice support structure according to claim 10 wherein each of said transition ramp members and main support members have a communicating opening at the center thereof which communicates with the interior of said annular tube.

14. The conductor splice and splice support structure according to claim 13 wherein said means for securing said two transition ramp members and said main support member together comprises at least one support bar within said opening extending through, and secured to, said main support member and said two transition ramp members when the splice structure is fully assembled.

15. The conductor splice and splice support structure according to claim 14 wherein two of said bars are provided and prior to assembly of said transition ramp members to said main support members one of said bars is secured to each of said transition ramp members.

16. The conductor splice and splice support structure according to claim 10 further including a housing around said transition ramp members and main support member in fluid flow communication with said annular tube.

17. The conductor splice and splice support structure according to claim 16 further including a plurality of holes through said main support member in fluid flow communication between an opening within said main support member and the interior of said housing.

18. The conductor splice and splice support structure according to claim 17 further including duct means on said housing for admitting liquid coolant into said housing and through said holes.

19. The method of splicing two superconductor cable-in-conduit superconductor cables which comprises the steps of:

providing two superconductor cables each in an annular tube and having a plurality of spaced sub-cables each comprising stabilizer and superconductor strands;

removing any conduit and other support material from sub-cables at the ends of the cables to be spliced;

placing each sub-cable in an outer groove in a transition ramp member which varies in configuration from a first end that approximately conforms to the cable configuration to an oval second end;

wrapping the ends of a pair of sub-cables to be spliced with a braid of superconducting material in an overlapping arrangement;

placing the overlapped ends of said sub-cables in a groove in an oval cross section support member between two transition members; and filling said transition ramp members and support member grooves with solder.

20. The method according to claim 19 including the further step of forming a closed housing around said transition ramp members and said main support member in fluid flow communication with said annular tube.

21. The method according to claim 20 further including providing fluid flow channels between said housing interior and the space within said annular tube.

22. The method according to claim 21 further including directing a flow of coolant into said housing and to said annular tube and the interior of said annular tube.

23. The method according to claim 19 wherein said braid is wrapped on said sub-cable ends by inserting said sub-cable ends into a braided tube of superconductor material and drawing the braid tight against said sub-cable ends.

* * * * *